United States Patent [19]

Maniar et al.

[11] Patent Number: 5,652,176
[45] Date of Patent: Jul. 29, 1997

[54] METHOD FOR PROVIDING TRENCH ISOLATION AND BORDERLESS CONTACT

[75] Inventors: Papu D. Maniar; Robert W. Fiordalice, both of Austin, Tex.

[73] Assignee: Motorola, Inc., Schaumburg, Ill.

[21] Appl. No.: 393,783

[22] Filed: Feb. 24, 1995

[51] Int. Cl.$^6$ .............................. H01L 21/76; H01L 21/28
[52] U.S. Cl. .............................................. 437/67; 437/195
[58] Field of Search .................... 437/67, 228 TR, 437/195; 198/DIG. 50, DIG. 85, DIG. 86; 257/514

[56] References Cited

U.S. PATENT DOCUMENTS

| | | |
|---|---|---|
| 4,030,942 | 6/1977 | Keenan et al. |
| 4,274,891 | 6/1981 | Silvestri et al. |
| 4,519,128 | 5/1985 | Chesebro et al. ............... 29/576 W |
| 4,656,497 | 4/1987 | Rogers et al. |
| 5,268,330 | 12/1993 | Givens et al. |
| 5,270,263 | 12/1993 | Kim et al. |
| 5,384,281 | 1/1995 | Kenney et al. |
| 5,441,094 | 8/1995 | Pasch |
| 5,447,884 | 9/1995 | Faaey et al. |
| 5,492,858 | 2/1996 | Bose et al. |

OTHER PUBLICATIONS

J. Givens, et al.; "Selective dry etching in a high density plasma for 0.5 μm complementary metal-oxide-semiconductor tech.;" J. Vac. Sci. Technol. B, vol. 12, No. 1, pp. 427-432 (Jan./Feb. 1994).

C. Yu, et al.; "Deposition, Characterization, and Application of Aluminum Nitride Thin Films for Microelectronics;" Mat. Res. Soc. Symp. Proc., vol. 264, pp. 401-405 (1992).

S. Bhat, et al.; "Reactive Ion Beam Deposition of Aluminum Nitride Thin Films;" Journal of Elect. Materials, vol. 14, No. 4, pp. 405-418 (1985).

R.K. Sadhir, et al.; "Preparation of Aluminum Nitride Thin Films for Use in Microelectronics;" IEEE; Ch. 2452-1, pp. 17-21 (1987).

R.G. Gordon, et al.; "Chemical vapor deposition of aluminum nitride thin films;" J. Mater. Res., vol. 7, No. 7, pp. 1679-1684 (1992).

S.J. Pearton, et al.; "Dry and wet etching characteristics of InN, AlN, and GaN deposited by electron cyclotron . . . ;" J. Vac. Sci. Technol. A, vol. 11, No. 4, pp. 1772-1775 (1993).

P.B. Legrand, et al.; "Optical properties of sputter-deposited aluminium nitride films on silicon;" SSDI, pp. 220-223 (1994).

*Primary Examiner*—George Fourson
*Attorney, Agent, or Firm*—Patricia S. Goddard

[57] ABSTRACT

A trench isolation region (32) is fabricated to include a trench liner (28) comprised of aluminum nitride. The aluminum nitride trench liner is useful in borderless contact applications wherein a contact opening (56) is etched in an interlayer dielectric (54) and overlies both an active region (e.g. doped region 52) and the trench isolation region. During formation of opening using etch chemistry which is selective to aluminum nitride, the trench liner protects a P-N junction at a corner region (58) of the trench to prevent exposing the junction. By protecting the junction, subsequent formation of a conductive plug (60) will not electrically short circuit the junction, and will keep diode leakage to within acceptable levels.

13 Claims, 3 Drawing Sheets

METHOD FOR PROVIDING TRENCH ISOLATION AND BORDERLESS CONTACT

CROSS-REFERENCE TO RELATED APPLICATIONS

Material related to the subject matter of the present invention is disclosed in the following co-pending, commonly assigned patent applications:

1) Ser. No. 08/270,545, filed Jul. 5, 1994, by Venkatesan et al., entitled, "Process for Fabricating a Semiconductor Device Using Dual Planarization Layers;"

2) Ser. No. 08/393,781, filed concurrently herewith, by Maniar et al., entitled, "Semiconductor Device Having Anti-Reflective Coating and Method for Making the Same," now U.S. Pat. No. 5,525,542 which issued on Jun. 11, 1996; and 3) Ser. No. 08/393,782, filed concurrently herewith, by Fiordalice et al., entitled, "Method for Forming a Plug and Semiconductor Device Having the Same."

FIELD OF THE INVENTION

The present invention relates to semiconductor manufacturing in general, and more specifically to methods for providing trench isolation in semiconductor devices.

BACKGROUND OF THE INVENTION

Trench isolation is fast becoming the standard means of isolation in complex semiconductor devices, replacing the well established LOCOS (Localized Oxidation of Silicon) method of isolation. In a standard trench isolation process, trenches are formed in a semiconductor substrate between what are to become active areas that need to be isolated from one another. The trenches are filled with an insulating material, such as oxide, to provide electrical insulation. Active devices, including transistors and resistors, are then built and formed on and over the semiconductor substrate in appropriate active regions and in-between the isolation trenches.

One problem with standard trench isolation processes is the difficulty in forming borderless contacts over the trench regions. A borderless contact is a contact which overlies and exposes both the active and isolation regions of the semiconductor substrate, usually for the purpose of making contact to a diffusion region formed in the substrate. The problem of forming borderless contacts in combination with trench isolation involves the difficulty in etching contact openings in interlayer dielectrics while maintaining integrity of the trench isolation regions. For example, in order to make a contact to a diffusion region which abuts a trench isolation region, an opening must be formed in overlying interlayer dielectric layers to expose the diffusion region. In the case of a borderless contact, the contact opening will also overlie and expose a portion of the trench isolation region. Because the interlayer dielectric materials and the material used to form the trench isolation are generally very similar (both being primarily silicon dioxide), the trench isolation material is often etched during formation of the contact opening. The result is to recess the trench isolation material along the trench sidewalls. The recessed isolation is problematic upon subsequently depositing a conductive material into the contact opening. If the trench isolation material is recessed to the extent that it falls below the adjacent diffused region, a P-N junction will be exposed along the trench sidewall. Upon depositing a conductive material in the contact opening, the P-N junction will be electrically short circuited, rendering the device inoperable.

One solution to the problem of forming borderless contacts over trench isolation regions is to form a silicon nitride etch stop layer over the device prior to depositing the interlayer dielectric. In etching the contact opening, a first etch chemistry is used to etch through the interlayer dielectric, stopping on the silicon nitride etch stop layer. A subsequent etch chemistry is used to remove the silicon nitride etch stop layer within the contact opening to expose the diffused region. Because the etch stop layer also overlies the trench isolation region, the isolation material is protected from the interlayer dielectric etch and does not become recessed. However, problems with the use of such an etch stop layer are that 1) a chemistry selective to the etch stop must be developed and 2) eventually, the etch stop must also be removed to make contact to the active regions. Furthermore, the etch stop removal chemistry still has the potential to recess the trench fill oxide and expose the trench sidewall.

BRIEF DESCRIPTION OF A PREFERRED EMBODIMENT

Figure 1:
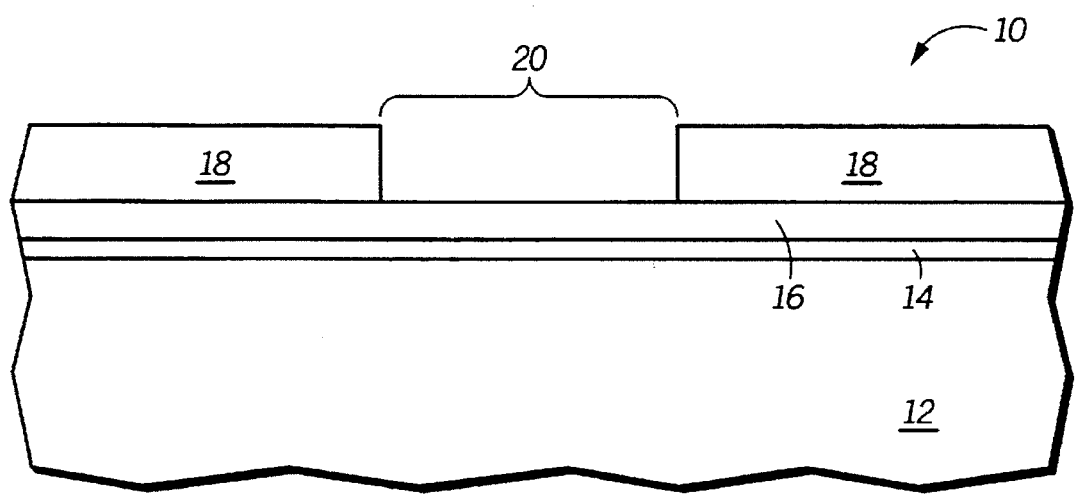
FIGS. 1–6 illustrate, in cross-section, a portion of a semiconductor device as it undergoes sequential processing steps for forming a lined trench isolation region in accordance with one embodiment of the present invention.

Generally, the present invention is a process for forming trench isolation in semiconductor devices using an aluminum nitride trench liner. The aluminum nitride liner lines the sidewalls and bottom surface of the isolation trench, while conventional trench isolation materials are used to fill the trench. Common silicon dioxide interlayer dielectric materials can be etched selectively to aluminum nitride. Therefore, upon forming a borderless contact opening overlying the trench, the aluminum nitride liner along the trench sidewall remains intact and protects against exposing any junctions which are formed along the trench sidewall or other trench surface. The aluminum nitride liner withstands exposure to wet hydrofluoric (HF) acid cleans and etches, and has low etch rates in dry fluorine chemistries. Thus, the liner withstands many processing operations without significant degradation or recessing. Moreover, aluminum nitride has a coefficient of thermal expansion comparable to that of silicon, such that use of an aluminum nitride trench liner will not impose undesirable stress levels in a silicon substrate.

These and other features and advantages of the present invention will be more clearly understood from the following detailed description taken in conjunction with the accompanying drawings. It is important to point out that the illustrations are not necessarily be drawn to scale, and that there may be other embodiments of the present invention which are not specifically illustrated. Further, it is noted that like reference numerals are sometimes used to designate identical or corresponding parts throughout the several views.

FIGS. 1-6 illustrate a portion of a semiconductor device 10 wherein a trench isolation region is formed and lined in accordance with a process of the present invention. In one embodiment, device 10 includes a semiconductor substrate 12 having an overlying pad oxide layer 14 and a polish stop layer 16. In preferred forms of the present invention, substrate 12 is a silicon wafer, although other semiconducting starting materials can be used in accordance with the present invention. Pad oxide layer 14 is preferable a thermally grown silicon dioxide. Pad oxide layer 14 is not a necessary part of the present invention, but is often useful for minimizing stress related defects within the substrate. Polish stop layer 16 in one form is formed of silicon nitride. The polish stop will be subsequently used as a end point indicator for a polishing step used to planarize the trench isolation, as described later in reference to FIGS. 4 and 5. If polishing is not used, polish stop layer 16 is likewise not necessary for purposes of practicing the invention. While the combination of, and materials for, substrate 12, pad oxide layer 14, and polish stop layers 16 is explicitly disclosed, it is appreciated that other materials can be used for the same or similar purposes.

Overlying the substrate and the pad oxide and polish stop layers is a resist mask 18 having an opening 20 formed therein. Resist mask 18 is conventionally formed by depositing a resist material, such as photoresist, and patterning the resist in accordance with conventional lithography practices (e.g. by selectively exposing the resist to radiation and developing the resist in a solution). Opening 20 is created as a result of patterning the resist. Opening 20 in the resist mask defines where in device 10 a trench isolation region will be formed.

Figure 2:
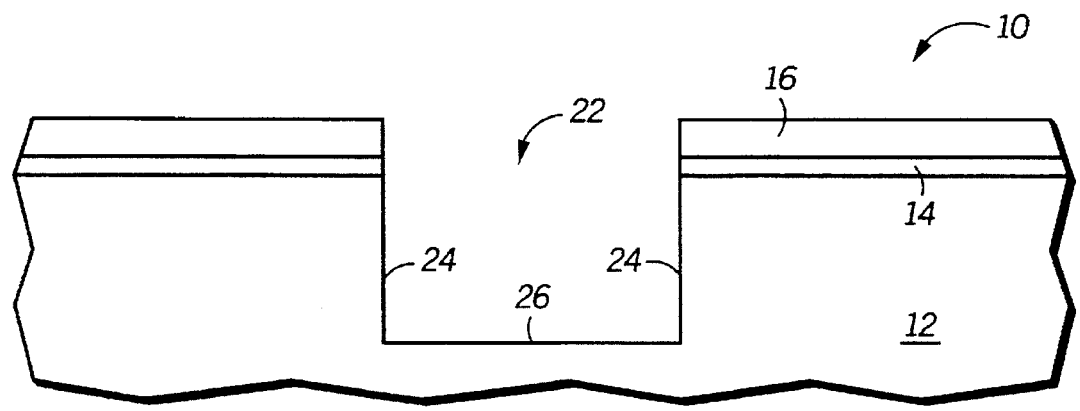

After forming opening 20 in resist mask 18, device 10 is subjected to a trench etch which results in forming a trench 22. Trench 22 is initially formed through polish stop layer 16, through pad oxide layer 14, and partially through substrate 12, as shown in FIG. 2. Using silicon nitride as a polish stop layer 16, thermally grown oxide as pad oxide layer 14, and silicon for substrate 12, trench 22 may be formed using a conventional dry fluorine-based etch chemistry. Although not illustrated, trench 22 may have tapered sidewalls because the extent of etch anisotropy often depends upon the crystallography of the substrate. For most applications, trench 22 should be etched to a depth of approximately 4000 to 6000 Å (400 to 600 nanometers) into the surface of substrate 12 and approximately, 4000 to 6000 Å (400 to 600 nanometers) wide. Actual trench dimensions will vary depending on the type of active devices needed to be isolated and the resolution capability of the lithography process used to define resist mask 18. After etching the trench, resist mask 18 is removed by conventional methods.

Figure 3:
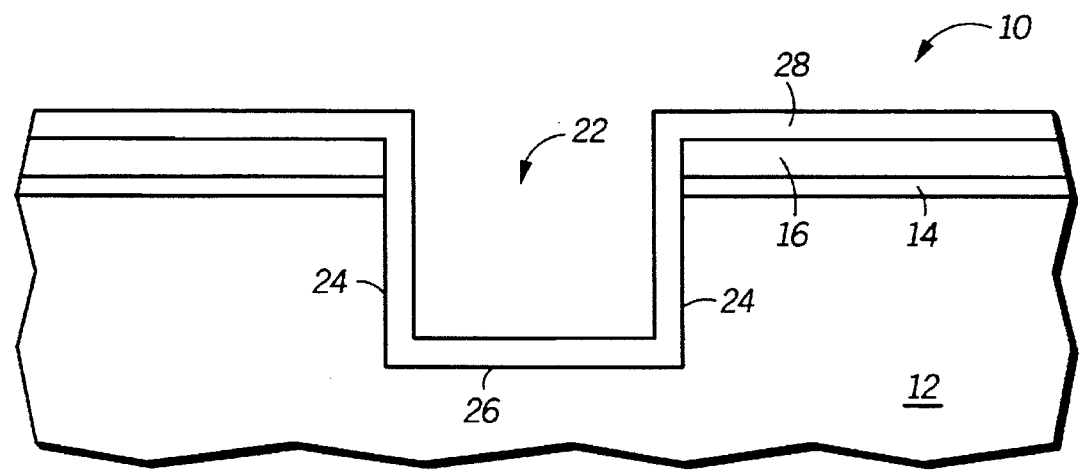
Figure 7:
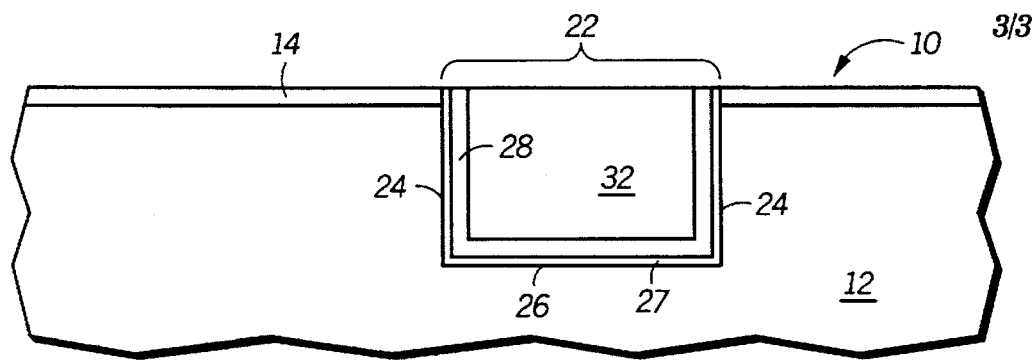
FIG. 7 is a cross-sectional illustration of an alternative embodiment wherein an oxide buffer layer is grown in the trench prior to depositing a trench liner, and also in accordance with the present invention.

Once trench 22 is formed, a trench liner 28 is deposited over device 10, as illustrated in FIG. 3. In accordance with the present invention, trench liner 28 is comprised of undoped aluminum nitride. Preferably, the trench liner is deposited by reactive sputtering (RS) of an aluminum target in a nitrogen or other inert environment. Specific process parameters are likely to vary by reactor type and other variables, but can generally be defined as using a substrate temperature of 20° to 500° C., a nitrogen partial pressure of 1.0 to 8.0 mTorr, and a cathode power of 0.5 to 8.0 kWatt. A sputter process using a composite aluminum nitride target in an inert environment is also suited for producing trench liner 28, in which case reactive mode sputtering need not be employed. Other methods of depositing aluminum nitride are also suitable for forming trench liner 28, for instance chemical vapor deposition (CVD). CVD has the advantages of better step coverage and lower stress in the deposited film as generally compared to sputtering. For use as a trench liner, aluminum nitride is preferably deposited to a thickness of between 200–400 Å (20–40 nanometers). As illustrated in FIG. 3, trench liner 28 is formed immediately adjacent the sidewalls 24 of trench 22; however, intervening materials can exist. For example, silicon dioxide can be thermally grown along the sidewalls and bottom of trench 22 prior to depositing aluminum nitride. One form of such an alternative is illustrated in FIG. 7, where a thermally grown oxide 27 is grown along the trench sidewalls and bottom to a thickness of between 50–100 Å (5 to 10 nanometers), prior to depositing trench liner 28. While intervening materials can be present between the aluminum nitride liner and the substrate, such intervening materials are not necessary since aluminum by itself has good adhesion to silicon, since the coefficient of thermal expansion (CTE) of aluminum nitride is comparable to that of silicon (CTE AlN=$4 \times 10^{-6}$ parts per million (ppm) per °C., CTE Si=$2.6 \times 10^{-6}$ ppm per °C.), and since aluminum nitride by itself has the etch selectivity necessary to protect trench sidewalls during subsequent processing. However, use of an intervening buffer layer, such as thermal oxide 27, may be desirable as a barrier to containment diffusion or to getter any impurities present along the trench sidewall.

Figure 4:
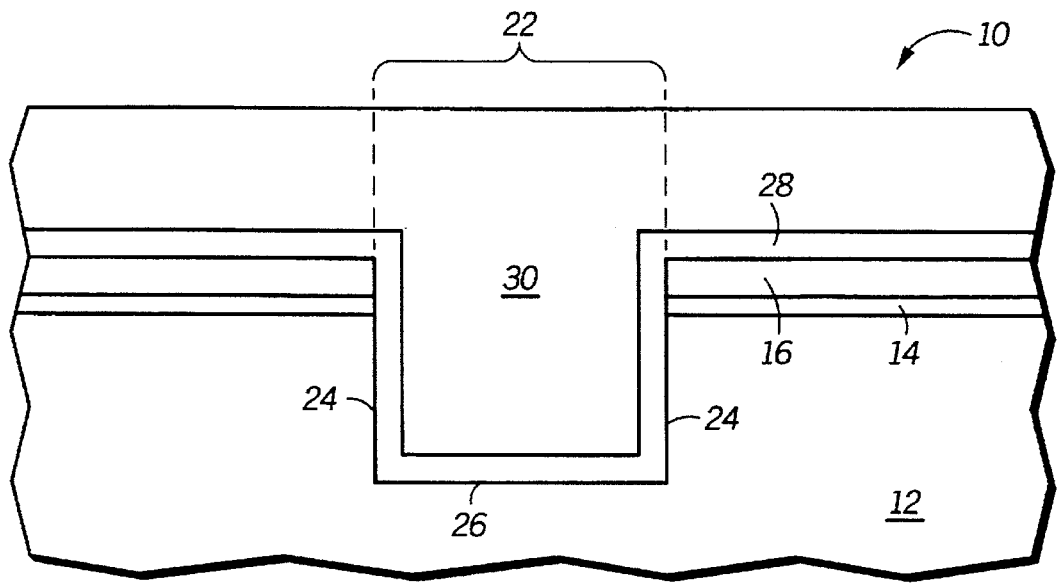

As illustrated in FIG. 4, a next step is to deposit a trench isolation material 30 over device 10 and filling trench 22. Any conventionally used trench isolation material can be used for material 30. In preferred forms of the invention, material 30 is a CVD deposited tetra-ethyl-ortho-silicate (TEOS), deposited with or without plasma enhancement. Silicon nitride, silicon oxy-nitride, tantalum pentoxide, germanium oxide, aluminum oxide, zirconium oxide, titanium oxide and the like, are also suitable isolation materials. Furthermore, material 30 need not be one material, but may instead be a series or combination of differing insulating materials. Isolation material 30 is deposited to a thickness sufficient to fill trench 22. Deposition of material 30 will also occur over substrate 12 in regions beyond trench 22. However, the thickness of isolation material 30 beyond trench 22 is not important, as these portions of the isolation material will subsequently be removed in a planarization process.

Figure 5:
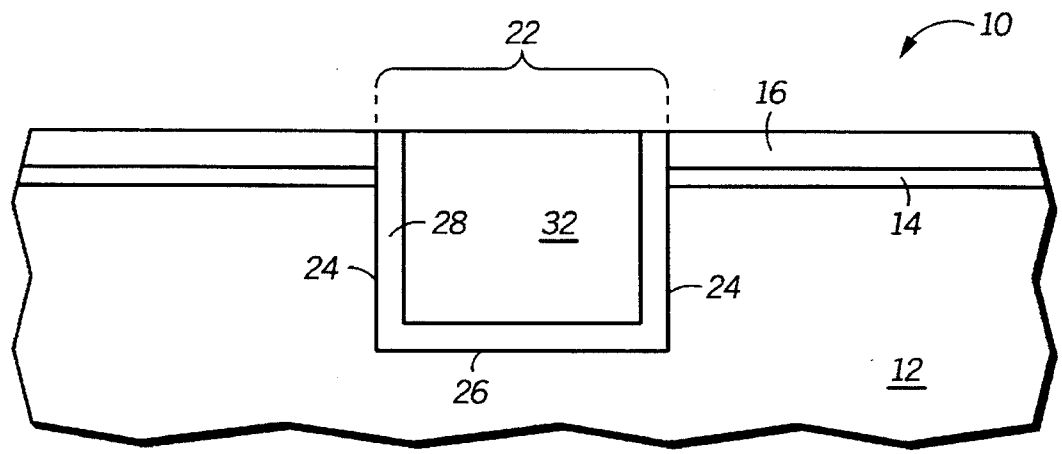

As indicated by FIG. 5, isolation material 30 is then planarized. Planarization can be achieved after filling trench 22 in any number of ways, including an etch-back process or a polishing process. Preferably a chemical-mechanical polishing (CMP) process is used to remove isolation material 30 as well as remove portions of the aluminum nitride trench liner 28 in regions beyond trench 22, as shown in FIG. 5. The result is to form a trench isolation region 32 within trench 22 and having an aluminum nitride trench liner 28. Beyond trench 22 polish stop layer 16 is exposed as a result of a CMP process, wherein exposure of polish stop layer indicates that polishing should cease. To polish both aluminum nitride and a CVD TEOS isolation material using the same polishing step, the wafer is press against a polyurethane-type polishing pad in the presence of a polishing slurry. A suitable slurry contains colloidal silica abrasives in an aqueous potassium hydroxide (KOH) solution, and has a pH greater than 7.

As an alternative to polishing, but not illustrated, an etch-back process can be used to planarize isolation material 30 to the trench level. In using an etch-back process, isolation material 30 is chemically etched until exposing aluminum nitride trench liner 28 in regions beyond trench 22. The etch selectivity between silicon dioxide based materials and aluminum nitride using fluorine chemistries is such that the aluminum nitride trench liner will serve as an etch stop for planarizing the isolation material. Upon etching the isolation material away, aluminum nitride trench liner 28 becomes exposed in regions beyond trench 22. These exposed regions are subsequently removed, for example, using a wet hot phosphoric etch. Note, however, that a hot phosphoric etch will also remove an underlying silicon nitride layer. Thus, if polish stop layer 16 is present and is made of silicon nitride, it too will be etched by hot phosphoric acid. However, this is not a problem because polish stop layer 16 is not necessary to be included in device 10 if an etch-back process is used instead of polishing. Without polish stop layer 16, the aluminum nitride layer beyond the trench can be removed selective to underlying oxide layers, such as pad oxide layer 14, using a hot phosphoric acid. It should also be noted that in using a wet etch to remove exposed aluminum nitride that there is the potential for recessing or etching portions of the aluminum nitride which line sidewalls 24 of trench 22. Thus, any wet etch used to remove aluminum nitride should be tightly controlled to avoid excessive recessing of the trench liner along the sidewalls. As an alternative to a wet etch-back, the aluminum nitride layer can be removed using a dry chlorine-based etch chemistry which is selective to a silicon nitride polish stop layer. The silicon nitride polish stop layer (which in this case is really an etch stop layer since planarization is achieved through etching rather than polishing) is then subsequently removed in a fluorine-based dry etch chemistry which is selective to the aluminum nitride lining the trench sidewalls.

Figure 6:
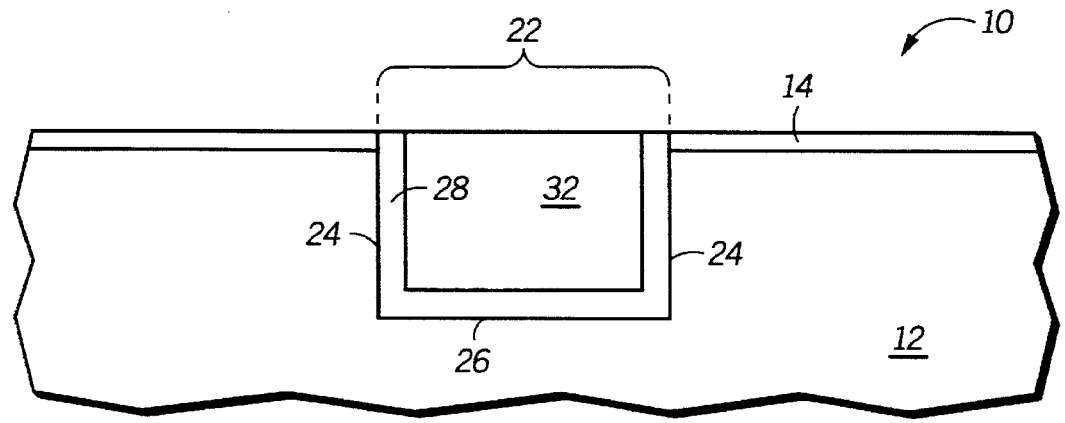

Continuing with the illustrated embodiment of the present invention which utilizes polishing as a planarization mechanism, polish stop layer 16 is removed after planarizing the trench isolation material, as shown in FIG. 6. The polish stop layer, in the case of being silicon nitride, can be removed selectively to underlying pad oxide layer 14 by using conventional fluorine chemistries. Any protruding portions of aluminum nitride trench liner 28 along the sidewalls of the trench as a result of removing the polish stop layer 16 can be removed in a controlled wet etch, although it is unlikely that significant protrusions will be present. Upon planarizing isolation material 30, and removing non-trench portions of aluminum nitride trench liner 28 as well as polish stop layer 16, device 10 includes trench isolation region 32 which is substantially planar with surrounding regions of substrate 12, as represented in FIG. 6. While as illustrated isolation region 30 is nearly perfectly planar with the surrounding substrate, it is understood that perfect planarity is hardly ever achievable. Rather, quite often trench isolation regions concavely recess during polishing processes, wherein the center of the isolation region is polished further back than edge regions of the isolation region.

Figure 8:
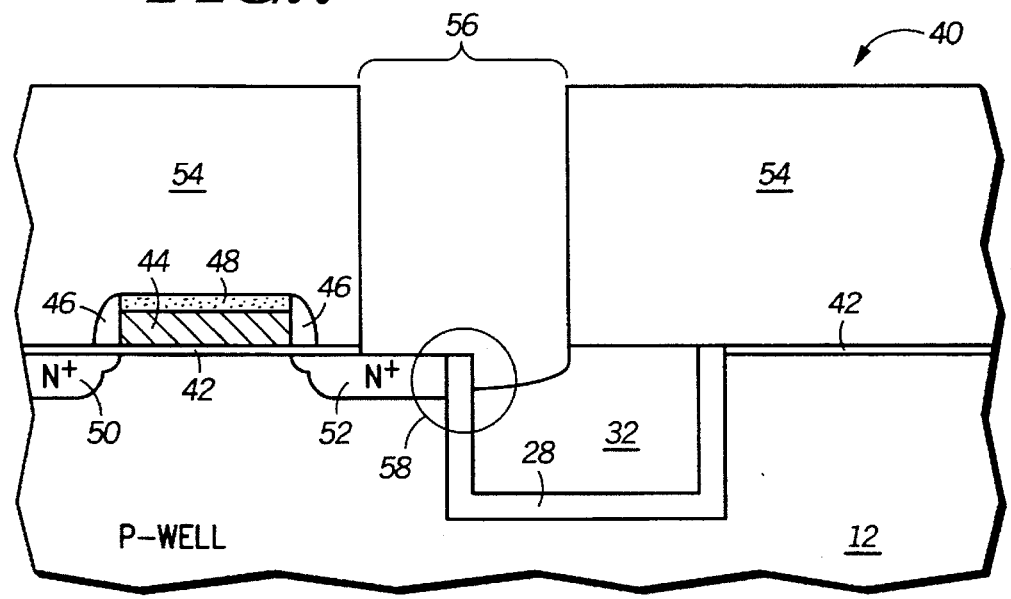
FIGS. 8 and 9 illustrate, in cross-section, a portion of a semiconductor device utilizing a lined trenched formed in accordance with the process illustrated and described in reference to FIGS. 1–6 in conjunction with the formation of a borderless contact to a diffused region.
Figure 9:
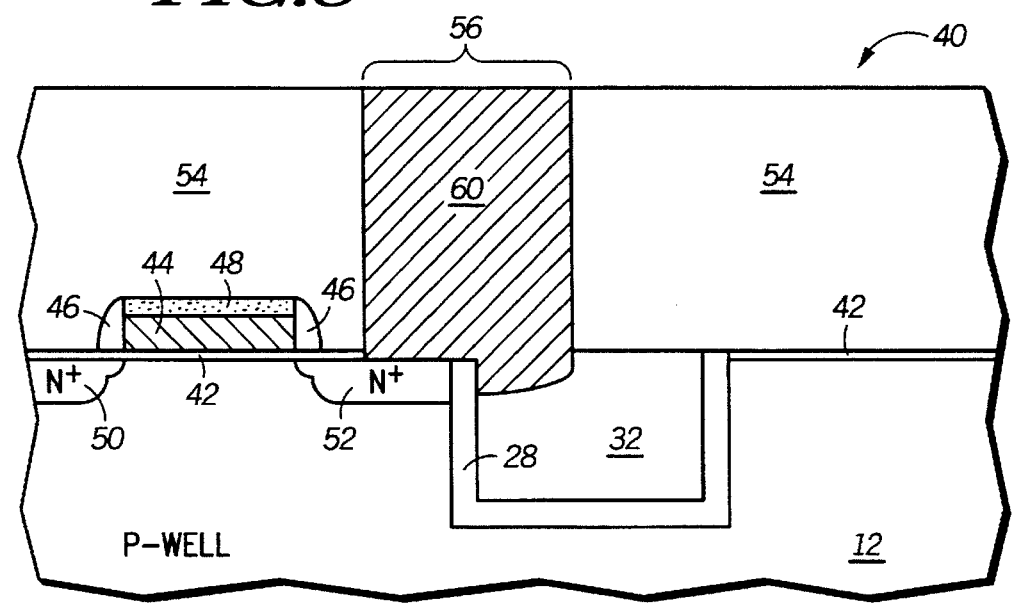

A useful application for a trench isolation region formed in accordance with the present invention as described in reference to FIGS. 1–6 is shown in a semiconductor device 40 represented in a partial cross-sectional view in FIGS. 8 and 9. Device 40 includes trench isolation region 32 having an aluminum nitride liner 28 as previously described. After forming a trench isolation region, pad oxide layer 14 is removed from the device and a new gate oxide layer 42 is grown in a conventional manner. Next, a polysilicon layer is deposited and patterned to form a gate electrode 44 for a metal-oxide-semiconductor (MOS) transistor. Gate electrode 44 may have optional silicon nitride sidewall spacers 46 and silicide region 48. Doped regions 50 and 52 are then formed in the substrate in a conventional manner by ion implantation to form source and drain regions of the MOS transistor. The doped regions may also include silicide regions which can be formed simultaneously with formation of silicide region 48, in accordance with conventional practices. For purposes of practicing the present invention, any conventional methods used for forming transistors and semiconductor devices can be used in conjunction with forming trench isolation in accordance with the present invention. Thus, the transistor configuration and fabrication process described herein is not essential for practicing the invention.

To operate the transistor, electrical contact must be made to doped region 52 (which serves as a drain of the transistor). One method for contacting doped region 52 is to form a borderless contact to the region. To form a borderless contact, an interlayer dielectric 54 is deposited over device 40 and is patterned and etched to form an opening 56 therein. Opening 56 overlaps both trench isolation region 32 and an active area (non-isolation area) of substrate 12, specifically overlapping doped region 52. In a preferred form, interlayer dielectric 54 is deposited boron-doped phospho-silicate glass (BPSG), although other oxides including PSG and TEOS, can instead be used. Opening 56 is preferably anisotropically dry etched in accordance with conventional processing. As illustrated in FIG. 8, etching through interlayer dielectric 54 also removes any gate oxide 42 which may be above doped region 52 within opening 56. Also as illustrated, a portion of trench isolation region 32 is also recessed during the etch. The recessing of isolation region 32 is because interlayer dielectric 54 and isolation region 32 are likely to both be silicon dioxide dielectrics, thus there is little selectivity between the two materials. Despite the recessing, there is no problem with exposing a P-N junction (the junction between N+ doped region 52 and a P-well of substrate 12 near a corner region 58 of the trench) because of the presence of aluminum nitride liner 28. Aluminum nitride is not readily etched in conventional fluorine chemistries used to etch silicon dioxide. Accordingly, the trench liner remains intact along the trench sidewalls, or at least insignificantly recessed. Because the aluminum nitride liner protects the junction, there is little possibility for subsequent electrical short circuiting of the junction. For example, as illustrated in FIG. 9, a conductive layer is deposited over device 40 and is polished or etched back to form a plug 60 within opening 56. In a preferred form, plug 60 is formed of tungsten or a combination of tungsten with titanium and titanium nitride layers deposited for adhesion and barrier purposes. Plug 60 is electrically isolated from the P-well due to the presence of trench liner 28. With little threat of electrically short circuiting the P-N junction beneath plug 60, diode leakage is more easily controlled.

The foregoing description and illustrations contained herein demonstrate many of the advantages associated with the present invention. In particular it has been revealed that borderless contacts can be formed over both active and isolation regions without fear of electrically short circuiting underlying P-N junctions. Use of a trench liner comprising aluminum nitride protects any junctions from exposure during a contact etch. Use of an aluminum nitride trench liner is easily incorporated into existing trench isolation processes by replacing or supplementing the use of thermally grown silicon dioxide trench liners or other deposited trench liners known in the art. Moreover, the use of aluminum nitride trench liner has the advantage of having a CTE that closely matches that of a silicon substrate, resulting in low stress. The aluminum nitride liner is resistant to many conventional cleaning solutions, such as an HF acid clean, and has a low etch rate in fluorine chemistries so that it remains intact along trench sidewalls throughout the formation of a contact to adjacent diffused regions and various other etch or cleaning operations.

Thus, it is apparent that there has been provided in accordance with the invention a method for providing trench isolation that fully meets the need and advantage set forth previously. Although the invention has been described and illustrated with reference to specific embodiments, it is not intended that the invention be limited to these illustrative embodiments. Those skilled in the art will recognize that modifications and variations can be made without departing from the spirit of the invention. For example, the present invention is not limited to any particular method for depositing aluminum nitride. In addition, the invention is not limited to any par way of planarizing a trench isolation region. Moreover, the present invention is not limited to use in applications involving formation of borderless contacts. Rather, the present invention can be used in conjunction with any trench isolation structure formed in a semiconductor device. Therefore, it is intended that this invention encompass all such variations and modifications as fall within the scope of the appended claims.

We claim:

1. A method for providing trench isolation in a semiconductor device comprising the steps of:
   providing a semiconductor substrate;
   forming a trench in the semiconductor substrate, the trench having a sidewall which is substantially vertical;
   lining the trench with a layer of aluminum nitride wherein the layer of aluminum nitride is immediately adjacent the sidewall of the trench;
   filling remaining portions of the trench with an isolation dielectric material to form an isolation region;
   depositing an interlayer dielectric over the semiconductor substrate, including over the trench; and
   etching an opening in the interlayer dielectric, wherein the opening overlies both a portion of the trench and a portion of the semiconductor substrate beyond the trench, and wherein etching is performed selectively to the layer of aluminum nitride.

2. The method of claim 1 wherein the step of lining comprises sputter depositing a layer of aluminum nitride to a thickness of between 20 to 40 nanometers.

3. The method of claim 2 wherein the step of lining comprises sputter depositing using a target comprised of aluminum in an environment comprising nitrogen.

4. The method of claim 1 wherein the step of filling remaining portions of the trench comprises depositing a silicon dioxide using tetra-ethyl-ortho-silicate.

5. A method for providing trench isolation in a semiconductor device comprising the steps of:
   providing a semiconductor substrate having a top surface;
   forming a stopping layer comprised of silicon nitride overlying the semiconductor substrate,
   forming a trench in the semiconductor substrate by etching through a portion of the stopping layer and a portion of the top surface of the semiconductor substrate, the trench having a bottom and having a sidewall which intersects the top surface of the semiconductor substrate at a corner region;
   depositing a layer of aluminum nitride over the semiconductor substrate to form a liner immediately adjacent the sidewall and the bottom of the trench;
   depositing an oxide over the semiconductor substrate and filling remaining portions of the trench;
   planarizing the oxide back to achieve a trench isolation region which is substantially planar with any layers surrounding the trench;
   depositing an interlayer dielectric over the semiconductor substrate, including over the trench and over the corner region of the trench; and
   etching an opening in the interlayer dielectric, wherein the opening is partially positioned over the trench and wherein etching is performed selective to the layer of aluminum nitride such that the liner remains intact near the corner region during etching.

6. The method of claim 5 wherein the step of planarizing comprises polishing, and wherein the stopping layer serves as a polish stopping layer.

7. The method of claim 5 wherein the step of planarizing comprises polishing, and wherein portions of the layer of aluminum nitride existing beyond the trench are removed during polishing.

8. The method of claim 5 further comprising the step of forming a P-N junction in the semiconductor substrate immediately adjacent the sidewall of the trench, and wherein the step of depositing a layer of aluminum nitride comprises protecting the P-N junction with the liner, and wherein the step of etching an opening comprises etching an opening without exposing the P-N junction.

9. The method of claim 8 further comprising the step of forming a conductive contact in the opening without electrically short-circuiting the P-N junction.

10. The method of claim 5 further comprising the step of forming a pad oxide layer between the semiconductor substrate and the stopping layer, and wherein the step of forming a trench comprises etching through a portion of the pad oxide layer.

11. A method for providing trench isolation in a semiconductor device comprising the steps of:
    providing a semiconductor substrate;
    forming a trench in the semiconductor substrate, the trench having a sidewall and a bottom;
    lining the trench with a layer of aluminum nitride wherein the layer of aluminum nitride is immediately adjacent the sidewall and the bottom of the trench;
    filling the trench with an isolation dielectric material to form an isolation region;
    depositing an interlayer dielectric over the semiconductor substrate, including over the trench; and
    etching an opening in the interlayer dielectric, wherein the opening overlies both a portion of the trench and a portion of the semiconductor substrate beyond the trench, and
    wherein etching is performed selectively to the layer of aluminum nitride lining the trench.

12. The method of claim 11 wherein the step of etching comprises dry etching using a fluorine-based chemistry.

13. The method of claim 11 wherein the step of forming a trench comprises forming a trench having a boundary defined at least in part by a substrate region of first conductivity immediately adjacent to a substrate region of second conductivity which together form a junction, and the method further comprising the steps of:
    depositing an interlayer dielectric over the semiconductor substrate, including over the trench;
    etching an opening in the interlayer dielectric, wherein the opening overlies at least a portion of both the trench and an area of the semiconductor substrate beyond the trench, and overlies the junction; and
    forming a conductive contact to the substrate region of first conductivity without electrically short-circuiting the junction.

\* \* \* \* \*